United States Patent
Divvela et al.

(10) Patent No.: US 12,231,125 B1
(45) Date of Patent: Feb. 18, 2025

(54) POWER EFFICIENT RETENTION FLIP FLOP CIRCUIT

(71) Applicant: SYNOPSYS, INC., Sunnyvale, CA (US)

(72) Inventors: Sai Yaswanth Divvela, Andhra Pradesh (IN); Amit Verma, Telangana (IN); Basannagouda Reddy, San Jose, CA (US); Deepak D. Sherlekar, Cupertino, CA (US)

(73) Assignee: SYNOPSYS, INC., Sunnyvale, CA (US)

( * ) Notice: Subject to any disclaimer, the term of this patent is extended or adjusted under 35 U.S.C. 154(b) by 0 days.

(21) Appl. No.: 18/208,753

(22) Filed: Jun. 12, 2023

(51) Int. Cl.
*H03K 3/037* (2006.01)
*H03K 3/012* (2006.01)

(52) U.S. Cl.
CPC ............. *H03K 3/037* (2013.01); *H03K 3/012* (2013.01)

(58) Field of Classification Search
CPC ....................................................... H03K 3/037
USPC ........................................................... 327/211
See application file for complete search history.

(56) References Cited

U.S. PATENT DOCUMENTS

2021/0357567 A1\* 11/2021 Sherlekar .............. G06F 30/392

\* cited by examiner

Primary Examiner — Tomi Skibinski
(74) Attorney, Agent, or Firm — WOMBLE BOND DICKINSON (US) LLP

(57) ABSTRACT

A circuit includes: a first latch; a second latch coupled to the first latch; and a third latch coupled to the second latch at an input terminal of the second latch, wherein the third latch includes: a first inverter and a second inverter, the first inverter being coupled between the input terminal of the second latch and an input terminal of the second inverter and the second inverter being coupled between an output terminal of the first inverter and an input terminal of the first inverter; a first switch connecting the first inverter to a first voltage source; a second switch connecting the first inverter to ground voltage; a third switch connecting the second inverter to the first voltage source; a fourth switch connecting the second inverter to the ground voltage; and a fifth switch connecting the second latch and the first inverter.

20 Claims, 5 Drawing Sheets

POWER EFFICIENT RETENTION FLIP FLOP CIRCUIT

TECHNICAL FIELD

The present disclosure relates to digital circuit design. In particular, the present disclosure relates to a power efficient retention flip flop circuit.

BACKGROUND

As a result of technology scaling, leakage power has become a significant contributor to the total power consumption of an electronic circuit. Therefore, reducing the power consumption due to the leakage current may significantly reduce power consumption of an electronic device.

The above information in the Background section is only for enhancement of understanding of the background of the technology and therefore it should not be construed as admission of existence or relevancy of the prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

In one or more embodiments, a circuit includes: a first latch; a second latch coupled to the first latch at an output terminal of the first latch; and a third latch coupled to the second latch at an input terminal of the second latch, wherein the third latch includes: a first inverter and a second inverter, the first inverter being coupled between the input terminal of the second latch and an input terminal of the second inverter and the second inverter being coupled between an output terminal of the first inverter and an input terminal of the first inverter; a first switch connecting the first inverter to a first voltage source; a second switch connecting the first inverter to ground voltage; a third switch connecting the second inverter to the first voltage source; a fourth switch connecting the second inverter to the ground voltage; and a fifth switch connecting the input terminal of the second latch and the input terminal of the first inverter.

In one or more embodiments, the first switch includes a first transistor and a second transistor; the first inverter includes a third transistor and a fourth transistor; the second switch includes a fifth transistor and a sixth transistor; the third switch includes a seventh transistor; the second inverter includes an eighth transistor and a ninth transistor; the fourth switch includes a tenth transistor; the fifth switch includes an eleventh transistor and a twelfth transistor; first terminals of the first transistor and the second transistor are coupled to the first voltage source and second terminals of the first and second transistors are coupled to a first terminal of the third transistor; a second terminal of the third transistor is coupled to a first terminal of the fourth transistor; a second terminal of the fourth transistor is coupled to first terminals of the fifth and sixth transistors; a first terminal of the seventh transistor is coupled to the first voltage source and a second terminal of the seventh transistor is coupled to a first terminal of the eighth transistor; a second terminal of the eighth transistor is coupled to a first terminal of the ninth transistor and a second terminal of the ninth transistor is coupled to a first terminal of the tenth transistor; a second terminal of the tenth transistor is connected to the ground voltage; first terminals of the eleventh and twelfth transistors are coupled to gate electrodes of the third and fourth transistors, the second terminal of the eighth transistor, and the first terminal of the ninth transistor; and second terminals of the eleventh and twelfth transistors are coupled to the output terminal of the first inverter.

In one or more embodiments, the first switch, the second switch, the third switch, and the fourth switch are shared between a plurality of retention flip flop circuits of a multi-bit retention flip flop circuit to generate a corresponding output bit from among a plurality of output bits of the multi-bit retention flip flop circuit, each of the plurality of retention flip flop circuits includes the circuit.

In one or more embodiments, the second latch includes: a third inverter and a fourth inverter, the third inverter having an input terminal coupled to the output terminal of the first latch and an output terminal coupled to an input terminal of the fourth inverter, the fourth inverter being coupled between the input terminal and the output terminal of the third inverter; a sixth switch connecting the fourth inverter to a second voltage source; a seventh switch connecting the fourth inverter to the ground voltage; and an eighth switch connecting an output terminal of the fourth inverter to the input terminal of the third inverter.

In one or more embodiments, the input terminal of the third inverter is coupled to the output terminal of the first latch via a ninth switch, and wherein the fifth switch is coupled to the output terminal of the first latch via the ninth switch.

In one or more embodiments, the output terminal of the third inverter is coupled to an input terminal of a fifth inverter and an output terminal of the fifth inverter is coupled to an output of the circuit.

In one or more embodiments, the third inverter includes a first transistor and a second transistor, wherein a first terminal of the first transistor is connected to the second voltage source, a second terminal of the first transistor is coupled to a first terminal of the second transistor, a second terminal of the second transistor is connected to the ground voltage, and gate electrodes of the first and second transistors are coupled to the output terminal of the first inverter; the sixth switch includes a third transistor and a fourth transistor; the fourth inverter includes a fifth transistor and a sixth transistor; the eighth switch includes a seventh transistor and an eighth transistor; the seventh switch includes a ninth transistor and a tenth transistor; first terminals of the first and second transistors are connected to the second voltage source and second terminals of the first and second transistors are coupled to a first terminal of the fifth transistor; a second terminal of the fifth transistor is coupled to a first terminal of the seventh transistor and a second terminal of the seventh transistor is coupled to a first terminal of the eighth transistor, the second terminal of the seventh transistor and the first terminal of the eighth transistor being coupled to the output terminal of the first latch and gate electrodes of the first and second transistors; a second terminal of the eighth transistor is coupled to a first terminal of the sixth transistor, a second terminal of the sixth transistor is coupled to first terminals of the ninth and tenth transistors, and second terminals of the ninth and tenth transistors are coupled to the ground voltage; and the second terminal of the first transistor and the first terminal of the second transistor are coupled to gate electrodes of the fifth and sixth transistors.

In one or more embodiments, the first switch and the second switch are configured to be turned on or turned off based on a first control signal and a second control signal; where the third switch and the fourth switch are configured to be turned on or turned off based on the first control signal, and the fifth switch is configured to be turned on or turned off based on the second control signal; where the circuit is configured to operate in a sleep mode or an active mode; where in the active mode, the first latch and the second latch are turned on, and in the sleep mode, the first latch and the second latch are turned off and the third latch is turned on; where when the circuit transitions from the active mode to the sleep mode, the third latch is configured to perform a save operation by saving a state of the second latch before the sleep mode, and when the circuit transitions from the sleep mode to the active mode, the third latch is configured to perform a restore operation by restoring the state of the second latch before the save mode from the third latch to the second latch; and where the circuit is configured to perform the save operation or the restore operation based on the first control signal.

In one or more embodiments, the first latch and the second latch are configured to receive a second voltage from a second voltage source different from the first voltage source, wherein the first voltage source is an always-on (AON) power supply and the second voltage source is a switchable power supply or a power-gated supply.

In one or more embodiments, a method of controlling a circuit, the method includes: receiving a first value of a first control signal at the circuit; based on receiving the first value of the first control signal, saving a state of a first latch to a second latch via a datapath of the circuit, wherein the second latch is connected to an input terminal of the first latch; receiving a second value of the first control signal; turning off the first latch for a first time period based on determining that the state of the first latch is saved to the second latch, the determining being based on the receiving the second value of the first control signal; turning on the first latch based on determining that the first time period is completed; receiving the first value of the first control signal; and based on receiving the first value of the first control signal, restoring the state of the first latch from the second latch to the first latch via the datapath of the circuit.

In one or more embodiments, the state of the first latch includes a voltage at the input terminal of the first latch. In one or more embodiments, the method further includes receiving, a first value of a second control signal, where the state of the first latch is saved to the second latch based on receiving the first value of the second control signal; and receiving, a second value of the second control signal, wherein the state of the first latch is restored from the second latch to the first latch based on receiving the second value of the second control signal.

In one or more embodiments, the method further includes: based on receiving the first value of the first control signal, turning on a first switch of the second latch to connect the input terminal of the first latch to a first node to save the state of the first latch, the first node being coupled to an output terminal of the first switch, an input terminal of a first inverter of the second latch, and an output terminal of a second inverter of the second latch; based on receiving the second value of the first control signal, turning off the first switch to disconnect the input terminal of the first latch from the first node; based on receiving the first value of the second control signal, maintaining a voltage at the first node that represents the state of the first latch by enabling the first inverter and the second inverter; based on receiving the second value of the second control signal, restoring the state of the first latch from the second latch to the first latch by turning on the first switch to connect the input terminal of the first latch to the first node, where the datapath includes the input terminal of the first latch, the first switch, and the first node.

In one or more embodiments, the method further includes: receiving, at the first latch, a first supply voltage from a first voltage source; and receiving, at the second latch, a second supply voltage, different from the first supply voltage, from a second voltage source, where the first voltage source is a switchable power supply or a power-gated supply and the second voltage source is an always-on (AON) power supply.

In one or more embodiments, a non-transitory computer readable medium including stored instructions, which when executed by a processor, cause the processor to generate a digital representation of a circuit includes: a first latch; a second latch coupled to the first latch at an output terminal of the first latch; and a third latch coupled to the second latch at an input terminal of the second latch, wherein the third latch is configured to: receive a first value of a first control signal; based on receiving the first value of the first control signal, save a state of the second latch to the third latch via a datapath of the circuit; receive a second value of the first control signal; and based on receiving the second value of the first control signal, restore the state of the second latch from the third latch to the second latch via the datapath of the circuit.

In one or more embodiments, the third latch is further configured to: receive a first value of a second control signal; based on receiving the first value of the second control signal, turn on a first switch of the third latch to connect the input terminal of the second latch to a first node to save the state of the second latch, the first node being coupled to an output terminal of the first switch, an input terminal of a first inverter of the third latch, and an output terminal of a second inverter of the third latch; receive a second value of the second control signal; turn off the first switch to disconnect the input terminal of the second latch from the first node; maintain a voltage at the first node that represents the state of the second latch; receiving the first value of the second control signal; based on receiving the second value of the first control signal and the first value of the second control signal, restoring the state of the second latch from the third latch to the second latch by turning on the first switch to connect the input terminal of the second latch to the first node, where the datapath includes the input terminal of the second latch, the first switch, and the first node.

In one or more embodiments, where the third latch is further configured to: maintain the voltage at the first node by enabling the first inverter and the second inverter by connecting the first inverter to an always-on (AON) power supply via a second switch and by connecting the second inverter to the AON power supply via a third switch.

In one or more embodiments, the circuit is configured to operate in a sleep mode or an active mode; in the active mode, the first latch and the second latch are turned on, and in the sleep mode, the first latch and the second latch are turned off and the third latch is turned on; when the circuit transitions from the active mode to the sleep mode, the third latch is configured to perform a save operation by saving the state of the second latch, and when the circuit transitions from the sleep mode to the active mode, the third latch is configured to perform a restore operation by restoring the state of the second latch from the third latch to the second latch; and the circuit is configured to perform the save operation or the restore operation based on the first control signal.

In one or more embodiments, during the saving of the state of the second latch to the third latch and during the restoring the state of the second latch from the third latch to the second latch, the third latch is configured to receive a first value of a second control signal.

In one or more embodiments, wherein the circuit is configured to: receive, at the first latch and at the second latch, a first supply voltage from a first voltage source; and receive, at the third latch, a second supply voltage, different from the first supply voltage, from a second voltage source, where the first voltage source is a switchable power supply or a power-gated supply and the second voltage source is an always-on (AON) power supply.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
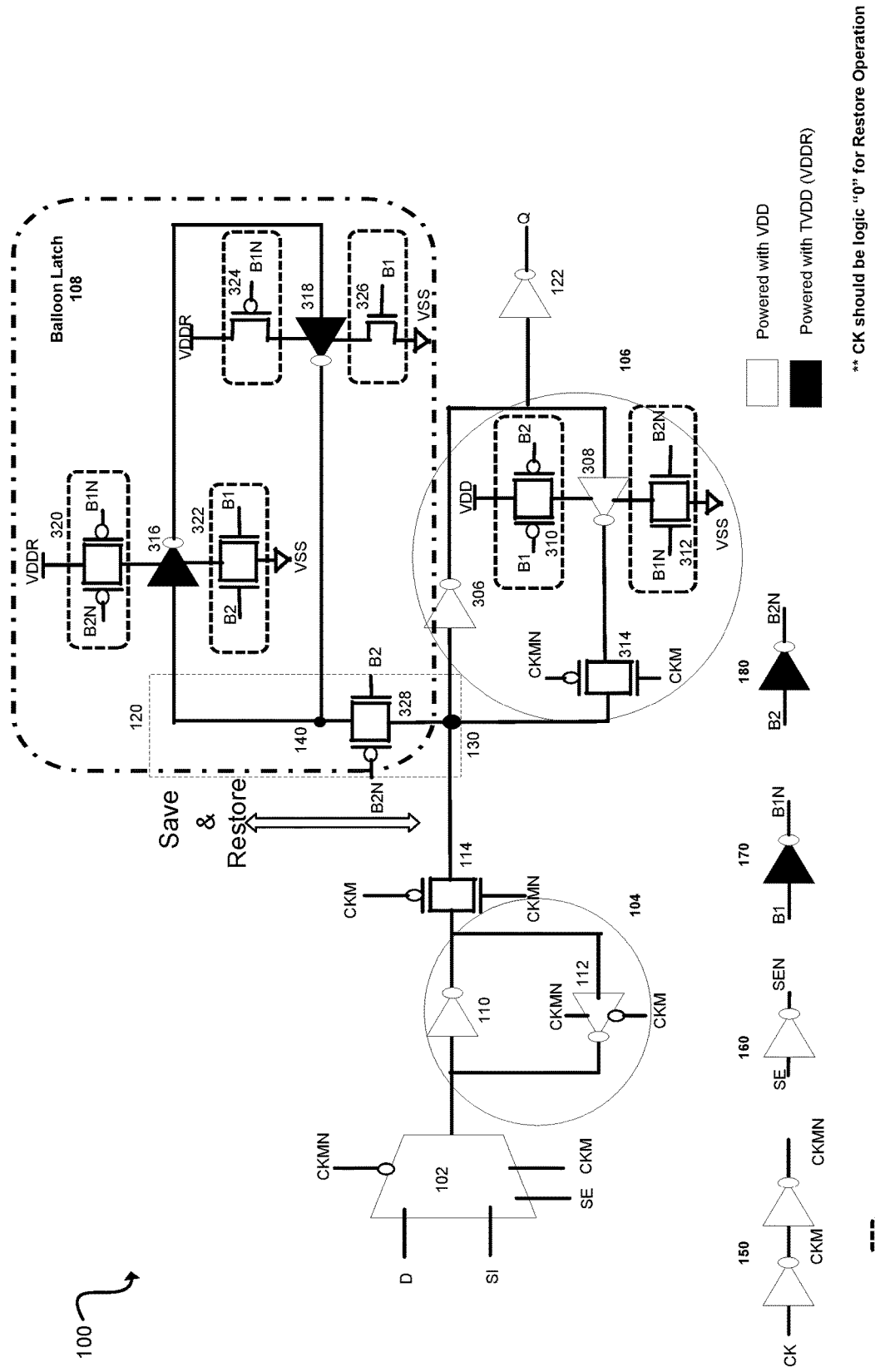
FIG. 1 illustrates a retention flip flop circuit, according to one or more embodiments.

Aspects of the present disclosure relate to a power efficient retention flip flop circuit.

Electronics technology have been growing in a very fast pace over the past several years. Due to these rapid developments in the electronics technology, electronic devices (e.g., cellular phones, tablets, laptops, etc.) have become faster and more powerful, and may include multiple processors, system-on-chips (SoCs), memories, and the like, which support the high-speed processing. Complementary metal oxide semiconductor (CMOS) technology has been regularly scaled down to achieve higher density, higher performance, and lower power consumption.

However, as a result of technology scaling, leakage power has become a significant contributor to the total power consumption of an electronic circuit. In some electronic circuits, more than 40% of the total power consumption may be due to the leakage currents and in case of an idle circuit, leakage current may contribute to the main source of power consumption. Therefore, reducing the power consumption due to the leakage current may significantly reduce the power consumption of an electronic device. For example, reducing the power consumption due to the leakage current may greatly increase the battery lifetime of a battery-powered portable electronic device.

In order to reduce the leakage power consumption, a power gating technique, which uses high-Vth sleep transistors between the low-Vth functional block and supply/ground rails, may be used. The electronic circuits that implement the power gating technique may operate in an active mode and a sleep mode. In the active mode, the transistors may connect the supply/ground rails and functional block to ensure the circuit is working properly, however, during the sleep mode, the idle leakage currents may be suppressed by cutting off the connection to the supply/ground rails. In sequential circuits, such as latches and flip flops, the circuit states may be lost during the sleep mode when the power gating technique is implemented. Data retention circuits, such as a retention flip flop, are used to retain the state of the sequential circuits while in sleep mode, such that the corresponding state can be restored when the circuit transitions from the sleep mode to the active mode. Therefore, retention flip flops, which stay on during the sleep mode, may be desired. However, adding retention flip flops in a sequential circuit may increase the design complexity and chip area, which in turn may contribute toward leakage power increase. Therefore, it is desired to have apparatuses and methods to reduce the leakage power consumption of a retention flip flop circuit.

Technical advantages of the present disclosure include, but are not limited to, reducing leakage power loss in a digital circuit during the active mode by turning off the power of a retention flip flop (also referred to as a balloon flip flop). One or more embodiments of the present disclosure may also occupy less layout area in an IC than other retention flip flop circuits. In one or more embodiments of the present disclosure, the leakage current from a balloon latch of a retention flip flop may be reduced. Further, in one or more embodiments of the present disclosure, the control signals having modified sequence are applied to the retention flip flop to utilize all possible states of the control signals. Moreover, in the retention flip flop according to one or more embodiments of the present disclosure, a common path is used for both save and restore operations (for example, unlike in a comparative retention flip flop where separate paths for save operation and restore operation are used), which may in turn reduce the overall area and number of components used in the retention flip flop and may also reduce power consumption.

FIG. 1 illustrates a retention flip flop circuit 100 according to one or more embodiments of the present disclosure.

The retention flip flop circuit 100 of FIG. 1 includes, at least, an optional multiplexer 102 (in some embodiments, the multiplexer 102 may be removed from the flip flop circuit 100), a first latch 104 (e.g., a primary latch), a second latch 106 (e.g., a secondary latch), a balloon latch 108, a switch 114, and an output inverter 122. The balloon latch 108 may be powered by VDDR (e.g., a first power supply or an always-on (AON) power supply, e.g., TVDD). Also, an inverter 170 to convert a control signal B1 to its complement B1N and an inverter 180 to convert a control signal B2 to its complement B2N may be powered by VDDR. However, the multiplexer 102, the first latch 104, the switch 114, the second latch 106, the output inverter 122, a buffer 150 to convert a clock input CK to an inverted clock input CKM and to convert the inverted clock input CKM to a buffered clock input CKMN (e.g., complement of CKM), and an inverter 160 to convert a select signal SE input to SEN (e.g., the complement of the select signal SE), may be powered by VDD (e.g., a second power supply or a switchable power supply or a power-gated supply).

The multiplexer 102 has a data input D, an inverted clock input CKM, a buffered clock input CKMN, a select signal SE input (e.g., the select signal SE is used to select between data input (D) during normal operation and scan input (SI) during test mode), and a scan chain serial input SI.

The first latch 104 includes two inverters 110 and 112. The inverter 110 may be connected between an output of the multiplexer 102 and an input of the switch 114, and the inverter 112 may be connected between the input and output terminals of the inverter 110. For example, an input of the inverter 112 may be connected to the output of the inverter 110 and an output of the inverter 112 may be connected to the input of the inverter 110. The inverter 112 may also receive an inverted clock input CKM and a buffered clock input CKMN.

The switch 114 may be connected between the first latch 104 and the second latch 106 and may receive an inverted clock input CKM and a buffered clock input CKMN.

Figure 2:
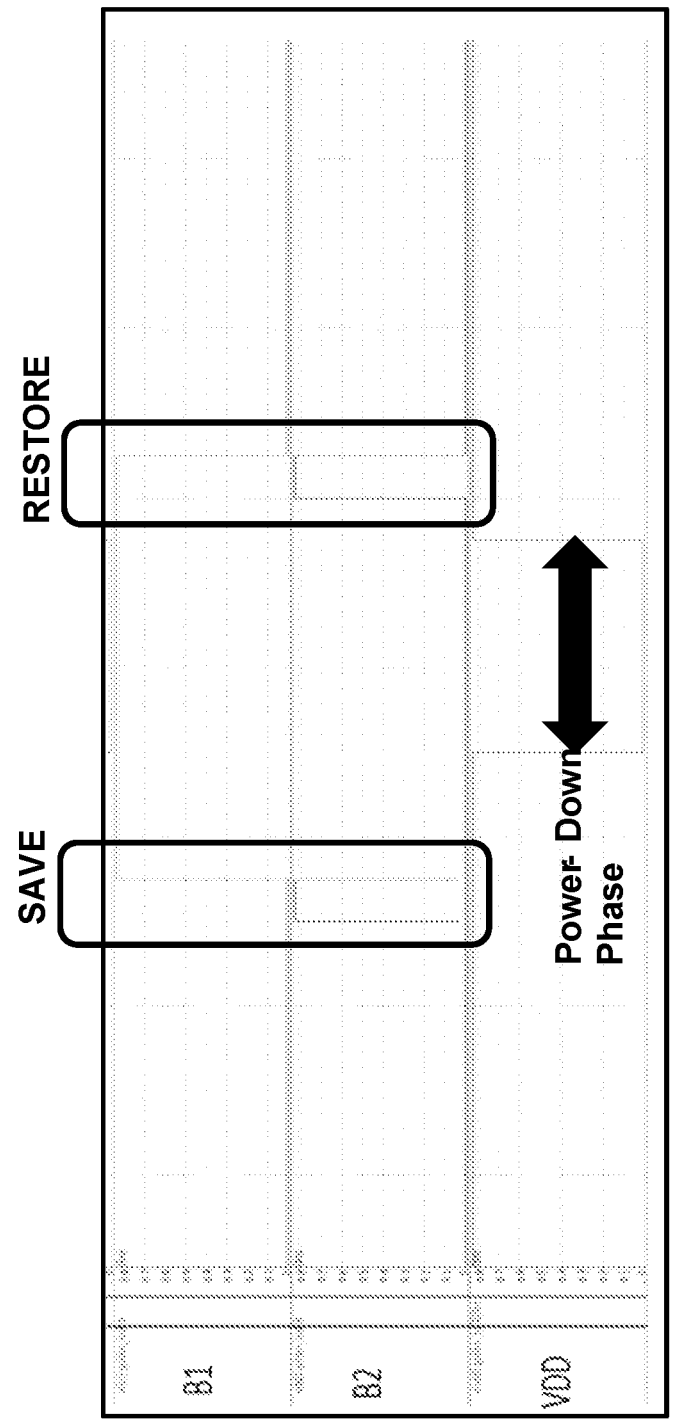
FIG. 2 illustrates a timing diagram, according to one or more embodiments.

In the retention flip flop 100 of FIG. 1, the control signals B1 and B2 (which may be generated by a predefined source) with a sequence as shown in FIG. 2 are applied to utilize all possible states of B1 and B2 including the state B1=B2=logic 1, which will be discussed later in details with respect to FIG. 2. In some embodiments, B2 may be a negative pulse and B1 may be enabled low. In such a case, the polarity of the transistors of the retention flip flop 100 may be adjusted accordingly, without deviating from the scope of the present disclosure.

In the retention flip flop 100 of FIG. 1, a common path 120 is used for both save and restore operations. As shown in FIG. 2, in the example embodiment of the retention flip flop 100 with B1 and B2 control signals having sequences as shown, the state of B1 determines whether to perform a save operation or to perform a restore operation. For example, when B1=logic 0, the save operation is performed and when B1=logic 1, the restore operation is performed. This will be discussed later in details with respect to FIG. 2.

Now the second latch 106 and the balloon latch 108 of the retention flip flop 100 of FIG. 1 will be described in more detail.

The second latch 106 includes two inverters 306 and 308, and three switches 310, 312, and 314. The inverter 306 may be connected between an output of the switch 114 and an input of the output inverter 122, and the inverter 308 may be connected between the input and output terminals of the inverter 306 via the switch 314. For example, an input of the inverter 308 may be connected to the output of the inverter 306 and an output of the inverter 308 may be connected to the input of the inverter 306 via the switch 314 and the node 130. The inverter 308 may also receive a power voltage (e.g., VDD) via the switch 310 and the inverter 308 may be connected to the ground (VSS or GND) via the switch 312. The switch 314 may receive an inverted clock input CKM and a buffered clock input CKMN. The switch 310 may be controlled by the control signals B1 and B2 and the switch 312 may be controlled by the control signals BIN (complement of B1) and B2N (complement of B2).

The balloon latch 108 includes two inverters 316 and 318, switches 320, 322, and 328, and transistors (or switches) 324 and 326. The inverter 316 may be connected between the input and the output terminals of the inverter 318, and the inverter 318 may be connected between the input and the output terminals of the inverter 316. For example, an input of the inverter 316 may be connected to the output of the inverter 318 and an output of the inverter 316 may be connected to the input of the inverter 318. The inverter 316 may also receive a power voltage (e.g., TVDD or VDDR) via the switch 320 and the inverter 316 may be connected to the ground (VSS) via the switch 322. The switch 322 may be controlled by the control signals B1 and B2 and the switch 320 may be controlled by the control signals BIN (complement of B1) and B2N (complement of B2). The inverter 318 may also receive a power voltage (e.g., TVDD or VDDR) from a power voltage source via the transistor (or switch) 324 and the inverter 318 may be connected to the ground (VSS) via the transistor (or switch) 326. The transistor 326 may receive the control signal B1 at the gate and therefore may be controlled by the control signal B1 and the transistor 324 may receive the control signal BIN at the gate and therefore may be controlled by the control signal BIN (complement of B1).

The balloon latch 108 is connected to the second latch 106 via the switch 328 and the node 130. For example, the input of the switch 328 may be connected to the output of the switch 114 and the input of the inverter 306 of the second latch 106. The output of the switch 328 may be connected to the input of the inverter 316 and the output of the inverter 318 of the balloon latch 108. The switch 328 may be controlled by the control signal B2 and its complement B2N.

To save leakage power loss from the balloon latch 108, during normal operation (or active mode), the balloon latch 108 may be turned off by cutting the path from always-ON supply of the balloon latch 108 to VSS (e.g., "0 V" or "ground" voltage) by updating the sequencing of the control signals B1 & B2. For example, the inverters 316 and 318 receive power (e.g., VDDR) from a power source via switches 320 and 324, respectively. During normal operation (or active mode), by turning off the switches 320 and 324 and the switches 322 and 326 (which control the connections of the inverters 316 and 318 to ground (e.g., VSS)) that are controlled by the control signals B1, BIN (complement of B1), B2, and B2N (complement of B2), the balloon latch 108 may be turned off and the leakage power loss from the balloon latch 108 may be reduced or minimized. However, as shown in FIG. 2, just before the sleep mode (as indicated by VDD being zero when the first latch 104 and the second latch 106 is powered down in a power-down phase), in order to retain (e.g., save) the state of the second latch 106, the balloon latch 108 may be turned on. Balloon latch 108 always turns on before the retention flip flop 100 circuit goes into the sleep mode, in order to save the state (e.g., voltage at the input terminal) of the second latch 106.

In the retention flip flop 100 of FIG. 1, a common path 120 is used for both save and restore operations and this common path 120 is controlled by the switch 328. The state of B1 determines whether to perform a save operation or to perform a restore operation as the switches 320, 322, 324, and 326 are controlled by the control signal B1 and its complement BIN. For example, when B1 is at logic 0, save operation is performed and when B1 is at logic 1, the restore operation is performed (B2 remains at logic 1 during both save and restore operation).

For example, as shown in FIGS. 1-2, during the save mode, B1 is at a low level and B2 has a high pulse. Therefore, the switch 328 (which is controlled by B2 and B2N) is turned on and the second latch 106 (e.g., the input of the inverter 306) may be connected to the node 140 of the balloon latch 108 via node 130 and the switch 328. Node 140 is connected to the input of the inverter 316 and the output of the inverter 318 of the balloon latch 108. During save mode, because B2 is at high level, inverter 316 is enabled. Therefore, the current state of the second latch 106 (e.g., voltage at node 130 or the voltage at the input terminal of the inverter 306 of the second latch 106) may be saved at node 140 of the balloon latch 108. At the end of the save mode, when B1 transitions from a low level to a high level and B2 transitions from a high level to a low level, the inverter 318 is enabled and switch 328 is turned off to hold the voltage at node 140. Then, as VDD transitions from a high level to a low level to turn off the first latch 104 and the second latch 106 for a desired time period (e.g., a predetermined time period), the second latch 106 can be powered down safely without losing the current state of the second latch 106.

After the desired time period (e.g., a predetermined time period), as VDD transitions from a low level to a high level to turn on the first latch 104 and the second latch 106, the state of latch 106 may be restored to the second latch 106. For example, during the restore mode, B2 has a high pulse (B1 is at logic 1), so the switch 328 is turned on and the node 140 is connected to node 130 (e.g., the input terminal of the inverter 306 of the second latch 106) via the switch 328. As such, the state of the second latch 106 before the sleep mode is restored to the second latch 106. After the restore operation is complete, B1 and B2 both go to low level, so that inverter 308 is enabled and input of the inverter 306 is inverted to go to the input of the inverter 122. As such, the state of latch 106 is saved before the power down or the sleep mode, and then restored to latch 106 after the end of the sleep mode or once the power is back up.

The retention flip flop 100 also has an output Q at the output of the output inverter 122 and may have separate power supply lines for the first latch 104 and the second latch 106, and the balloon latch 108. For example, the multiplexer 102, the first latch 104, the second latch 106, the switch 114 and the output inverter 122 may be powered by VDD and balloon latch 108 may be powered by TVDD or VDDR. In one or more embodiments, in the active mode, VDD may supply power to the multiplexer 102, the first latch 104, the second latch 106, along with the switch 114 and the inverter 122. During the sleep mode or power down mode, VDD is powered down such that the first latch 104 and the second latch 106 are powered down to reduce power consumption while the balloon latch 108 remains powered on by the VDDR to retain (e.g., save) the state of the second latch 106) via the save and restore path (e.g., the common path 120) shown in FIG. 1 via the switch 328, which is controlled by the signal B2 and B2N. When the system 100 is back to active mode from the sleep mode, the data retained by the balloon latch 108 may be restored to the second latch 106 via the save and restore path (e.g., the common path 120) shown in FIG. 1 via the switch 328 (e.g., when the system 100 is back to active mode from the sleep mode, the clock input CK is at logic 0, which turns off the switch 114 and cuts the connected between the first latch 104, and the common path 120 and the second latch 106).

FIG. 2 illustrates a timing diagram illustrating the control signals B1, B2, and the power voltage VDD during the save and restore operations and also during the power down mode of retention flip flop 100, according to one or more embodiments of the present disclosure. For example, FIG. 2 illustrates the control signals B1 and B2 with sequences to utilize all possible states of B1 and B2 including the state B1=B2=logic 1 as well.

For design applications, where the power down mode (or the retention mode) is not frequent, that is most of the time, the circuit operates in a normal mode or active mode, reducing leakage from the balloon latch of the retention flip flop saves significant leakage power.

One or more embodiments of the present disclosure (e.g., the retention flip flop 100 of FIG. 1) saves leakage power during normal operation (or active mode) by cutting the path from always-ON supply of the balloon latch to VSS (e.g., a third power supply, e.g., "0 V" or "ground" voltage) based on the sequencing of the control signals B1 & B2. For example, in one or more embodiments of the present disclose (e.g., the retention flip flop 100 of FIG. 1), during the normal operation (or active mode), the balloon latch may be turned off to save leakage power.

For example, as shown in FIG. 2, just before the sleep mode or power down mode (as indicated by VDD being zero), in order to retain (e.g., save) the state of the retention flip flop 100, a positive pulse in the control signal B2 may trigger the save operation. During the save operation, when the B2 pulse (e.g., the control signal B2 with the present sequence) transitions to zero, the control signal B1 will transition from zero to a positive value and maintain the positive value until the retention flip flop circuit 100 is back to the active mode from the sleep mode and the data is restored in the second latch 106. When the retention flip flop circuit 100 is back to the active mode from the sleep mode or the power down mode, a positive pulse in the control signal B2 may trigger the restore operation and during the restore operation, when the B2 pulse will transition to zero, the B1 will also transition to zero. As such, during the restore operation, both B1 and B2 may be at a logic level high. As shown in FIG. 2, the state of B1 determines whether to perform a save operation or to perform a restore operation. For example, when B1=logic 0, the save operation is performed and when B1=logic 1, the restore operation is performed.

For example, in FIG. 2, when B1=logic 0 and B2=logic 1, save operation is performed and when B1-logic 1 and B2-logic 1, restore operation is performed. However, during the normal operating period (e.g., the active mode) of the retention flip flop circuit 100, B1 and B2 may both remain at logic 0 (e.g., B1=logic 0 and B2=logic 0). As shown in FIG. 2, in this case with B1 and B2 control signals with modified sequences, both B1 and B2 can be active (e.g., at logic 1) at same time in the retention flip flop circuit 100.

Figure 3:
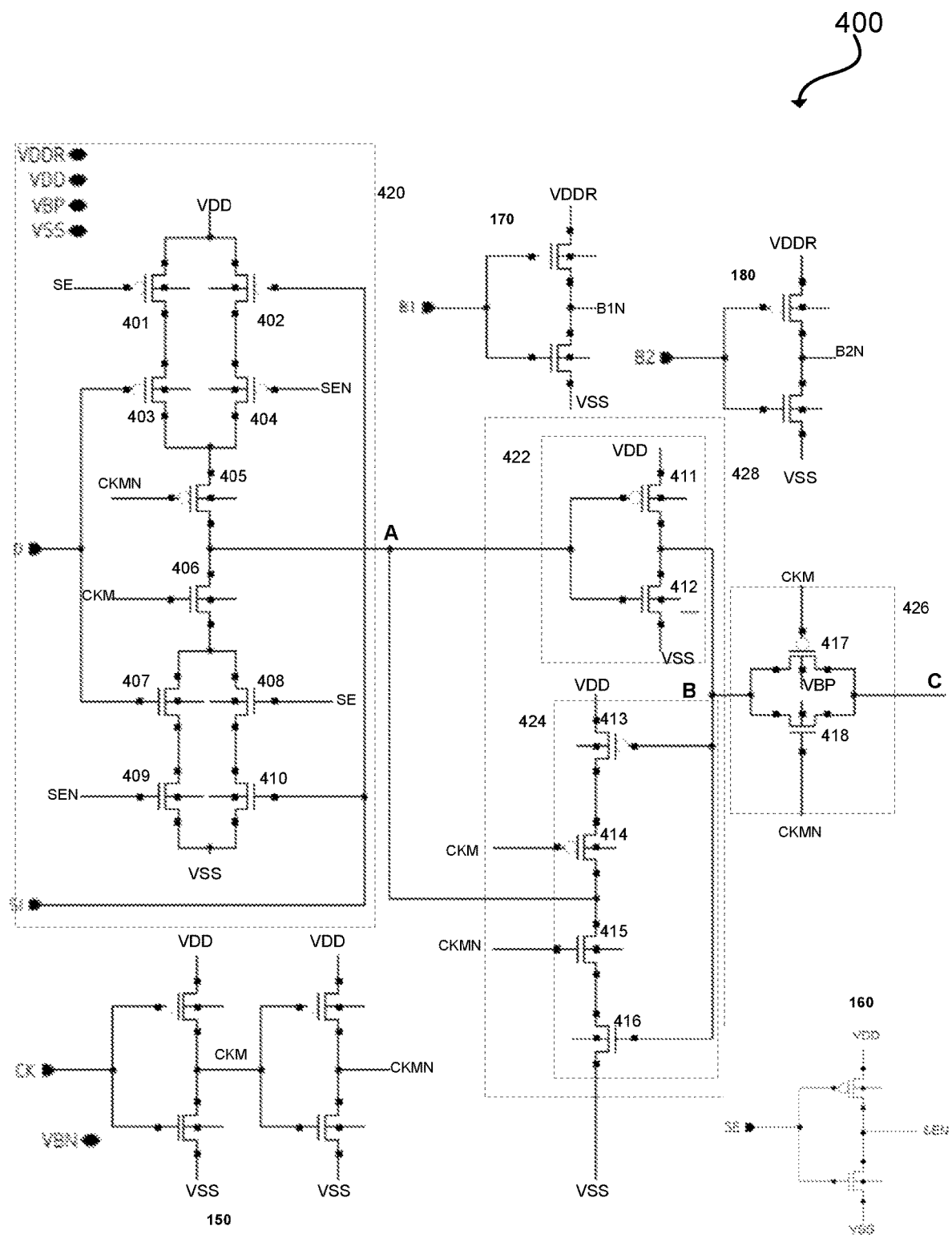
FIGS. 3-4 illustrate transistor level representations of a retention flip flop circuit, according to one or more embodiments.

FIG. 3 illustrates a transistor level representation 400 of a multiplexer 420, a first latch 428 including inverters 422 and 424, and a switch 426 that corresponds to components of FIG. 1.

For example, the multiplexer 102 of FIG. 1 may be represented by the circuit of multiplexer 420, the inverters 110 and 112 of the first latch 104 of FIG. 1 may be respectively represented by the circuits of the inverters 422 and 424 of the first latch 428, and the switch 114 of FIG. 1 may be represented by the circuit of the switch 426.

The multiplexer 420 includes two sets of transistors. The first set of transistors includes transistors 401, 402, 403, 404, and 405, and the second set of transistors includes the transistors 406, 407, 408, 409 and 410. The transistors in the first set (e.g., transistors 401, 402, 403, 404, and 405) may be P-type metal oxide semiconductor field effect transistors (MOSFET or PMOS transistors) and the transistors in the second set (e.g., the transistors 406, 407, 408, 409, and 410) may be N-type MOSFETs (or NMOS transistors).

A first electrode of the transistor 401 and a first electrode of the transistor 402 may be coupled together and also coupled to a power supply (e.g., VDD). A second electrode of the transistor 401 is connected to a first electrode of the transistor 403 and a second electrode of the transistor 402 is connected to a first electrode of the transistor 404. The second electrodes of the transistors 403 and 404 may be coupled together and also coupled to a first electrode of the transistor 405. A second electrode of the transistor 405 is connected to a first electrode of the transistor 406. A first electrode of the transistor 407 and a first electrode of the transistor 408 may be coupled together and also coupled to a second electrode of the transistor 406. A second electrode of the transistor 407 is connected to a first electrode of the transistor 409 and second electrode of the transistor 408 is connected to a first electrode of the transistor 410. The second electrodes of the transistors 409 and 410 may be coupled together and also coupled to a power supply (e.g., VSS).

In one or more embodiments, the gate electrodes of the transistors 401 and 408 may receive the select signal SE (e.g., for selecting data D/scan SI pins), the gate electrodes of the transistors 404 and 409 may receive a signal SEN (e.g., the complement of the select signal SE), the gate electrode of the transistor 406 may receive an inverted clock input CKM (e.g., complement of the first clock input CK), and the gate electrode of the transistor 405 may receive a buffered clock input CKMN (e.g., complement of CKM).

The data input D of the multiplexer 420 may be connected to the gate electrodes of the transistors 403 and 407 and the input SI may be connected to the gate electrodes of the transistors 402 and 410. In one or more embodiments, because, the multiplexer 420 has two inputs D and SI, with select signal SE and control signals CKM and CKMN, at a given time where the multiplexer 420 is enabled (when CK=0), one transistor pair from among the transistor pairs 401 and 403, 402 and 404, 407 and 409, and 408 and 410 may be active.

The output terminal of the multiplexer (e.g., node A) may be connected to the second terminal of the transistor 405 and the first terminal of the transistor 406.

The inverter 422 of the first latch 428 may include transistors 411 and 412. A first terminal of the transistor 411 may be coupled to a voltage source (e.g., VDD), a second terminal of the transistor 411 may be coupled to a first terminal of the transistor 412, and a second terminal of the transistor 412 may be connected to another power source (e.g., VSS). The gate electrodes of the transistors 411 and 412 are both connected to the output terminal of the multiplexer 420 or to the node A. The transistor 411 is a P-type MOSFET and the transistor 412 is an N-type MOSFET.

The inverter 424 of the first latch 428 may include transistors 413, 414, 415, and 416. A first terminal of the transistor 413 may be coupled to a voltage source (e.g., VDD), a second terminal of the transistor 413 may be coupled to a first terminal of the transistor 414, a second terminal of the transistor 414 may be coupled to a first terminal of the transistor 415, a second terminal of the transistor 415 may be coupled to a first terminal of the transistor 416, and a second terminal of the transistor 416 may be connected to another power source (e.g., VSS). The gate electrodes of the transistors 413 and 416 are both coupled together and further connected to a node B. The transistors 413 and 414 are both P-type MOSFETs and the transistors 415 and 416 are both N-type MOSFETs. In one or more embodiments, the gate electrode of the transistor 414 may receive an inverted clock input CKM and the gate electrode of the transistor 415 may receive a buffered clock input CKMN.

The switch 426 includes transistors 417 and 418. The first terminals of the transistors 417 and 418 are coupled together and also coupled to the node B and the second terminals of the transistors 417 and 418 are coupled together and also coupled to a node C. the transistor 417 may be a P-type MOSFET and the transistor 418 may be an N-type MOSFET. In one or more embodiments, the gate electrode of the transistor 417 may receive an inverted clock input CKM and the gate electrode of the transistor 418 may receive a buffered clock input CKMN.

Figure 4:
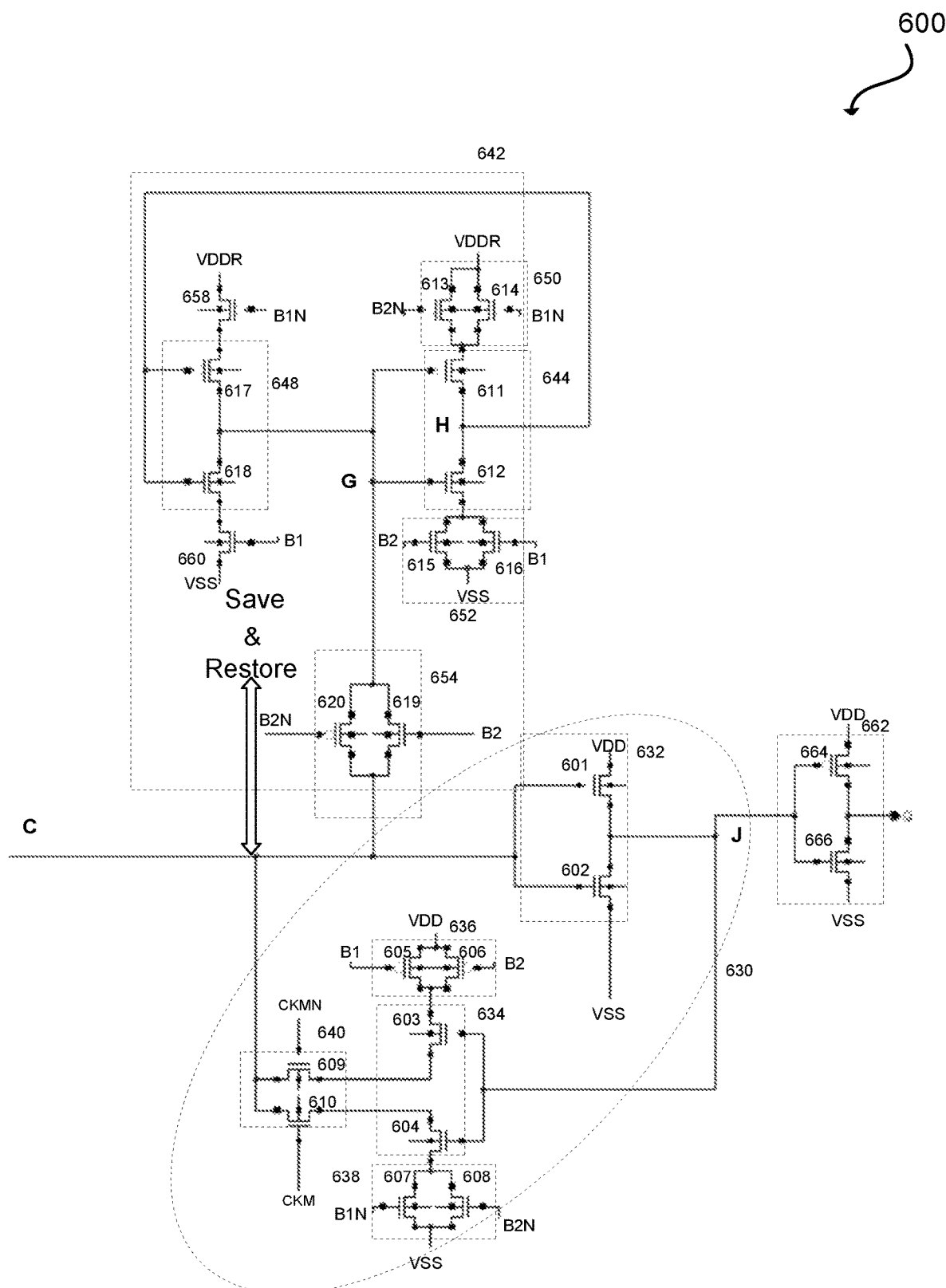

FIG. 4 illustrates a transistor level representation 600 of a second latch 630 including the inverters 632 and 634, and the switches 636, 638, 640, the balloon latch 642 including the inverters 644 and 648, and the switches 650, 652, and 654, and transistors 658 and 660, and the output inverter 662.

For example, the second latch 106 of FIG. 1 may be represented by the circuit of the second latch 630 of FIG. 4, the inverters 306 and 308 of FIG. 1 may be respectively represented by the circuits of the inverters 632 and 634 of FIG. 4, and the switches 310, 312, and 314 of FIG. 1 may be respectively represented by the circuits of the switches 636, 638, and 640 of FIG. 4, the balloon latch 108 of FIG. 1 may be represented by the circuit of the balloon latch 642 of FIG. 4, the inverters 316 and 318 of FIG. 1 may be respectively represented by the circuits of the inverters 644 and 648 of FIG. 4, and the switches 320, 322, and 328 of FIG. 1 may be respectively represented by the circuits of the switches 650, 652, and 654 of FIG. 4, transistors 324 and 326 of FIG. 1 may be respectively represented by the circuits of the transistors 658 and 660 of FIG. 4, and the output inverter 122 of FIG. 1 may be represented by the circuit of the inverter 662.

In FIG. 4, the inverter 632 of the second latch 630 may include the transistors 601 and 602. A first terminal of the transistor 601 may be connected to a power voltage (e.g., VDD) and a second terminal of the transistor 601 may be connected to a first terminal of the transistor 602. The second terminal of the transistor 601 and the first terminal of the transistor 602 are also connected to a node J. A second terminal of the transistor 602 may be connected to another power voltage (e.g., VSS). The gate electrodes of the transistors 601 and 602 may be connected to node C discussed with respect to FIG. 3. In FIG. 4, the transistor 601 may be a P-type MOSFET and the transistor 602 may be an N-type MOSFET.

The switch 636 of the second latch 630 includes transistor 605 and 606. A first terminal of the transistor 605 and a first terminal of the transistor 606 may be coupled together and may be further coupled to a power voltage (e.g., VDD). A second terminal of the transistor 605 and a second terminal of the transistor 606 may be coupled together and may be further coupled to a first terminal of the transistor 603 of the inverter 634 of the second latch 630. A second terminal of the transistor 603 may be coupled to a first terminal of the transistor 609 of the switch 640 of the second latch 630. A second terminal of the transistor 609 may be coupled to a first terminal of the transistor 610 of the switch 640 and may be further coupled to node C. A second terminal of the transistor 610 may be coupled to a first terminal of the transistor 604 of the inverter 634. A second terminal of the transistor 604 may be coupled to the first terminals of the transistors 607 and 608 of the switch 638, which are coupled together. The switch 638 of the second latch 630 may include the transistors 607 and 608. The second terminals of the transistors 607 and 608 may be coupled together and further connected to another power voltage (e.g., VSS).

The gate electrodes of the transistors 603 and 604 of the inverter 634 may be connected to node J. The gate electrode of the transistor 605 may receive the control signal B1 and the gate electrode of the transistor 607 may receive the control signal BIN, which is the complement of B1. The gate electrode of the transistor 606 may receive the control signal B2 and the gate electrode of the transistor 608 may receive the control signal B2N, which is the complement of B2. However, in one or more embodiments, the gate electrode of the transistor 605 may receive the control signal B2, the gate electrode of the transistor 607 may receive the control signal B2N, which is the complement of B2, the gate electrode of the transistor 606 may receive the control signal B1, and the gate electrode of the transistor 608 may receive the control signal BIN, which is the complement of B1. In one or more embodiments, the gate electrode of the transistor 610 may receive an inverted clock input CKM and the gate electrode of the transistor 609 may receive a buffered clock input CKMN. In this case, the transistors 605, 606, 603, and 609 are P-type transistors and the transistors 604, 607, 608, and 610 are N-type transistors.

The switch 654 may include transistors 619 and 620. A first terminal of the transistor 619 and a first terminal of the transistor 620 may both be coupled to each other and may further be connected to node C. A second terminal of the transistor 619 and a second terminal of the transistor 620 may both be coupled to each other and may further be connected to a node G. In one or more embodiments, the transistor 620 may be a P-type transistor and the transistor 619 may be an N-type transistor. In one or more embodiments, the gate electrode of the transistor 619 may receive the control signal B2 and the gate electrode of the transistor 620 may receive the control signal B2N which is the complement of B2.

In FIG. 4, the inverter 648 of the balloon latch 642 may include the transistors 617 and 618. A first terminal of the transistor 617 may be connected to a power voltage (e.g., VDDR) via the transistor 658 of the balloon latch 642. For example, a first terminal of the transistor 658 may be connected to a power voltage (e.g., VDDR) and a second terminal of the transistor 658 may be connected to a first terminal of the transistor 617. A second terminal of the transistor 617 may be connected to a first terminal of the transistor 618, a second terminal of the transistor 618 may be connected to a first terminal of the transistor 660, and a second terminal of the transistor 660 may be connected to another voltage source (e.g., VSS). The second terminal of the transistor 617 and the first terminal of the transistor 618 are also connected to node G. The gate electrodes of the transistors 617 and 618 may be coupled together and further connected to a node H. The transistor 660 may receive the control signal B1 at the gate and therefore may be controlled by the control signal B1 and the transistor 658 may receive the control signal BIN at the gate and therefore may be controlled by the control signal BIN (complement of B1). In FIG. 4, the transistors 658 and 617 may be P-type MOSFETs and the transistors 618 and 660 may be N-type MOSFETs.

In FIG. 4, the inverter 644 of the balloon latch 642 may include the transistors 611 and 612. A first terminal of the transistor 611 may be connected to a power voltage (e.g., VDDR) via the switch 650 of the balloon latch 642. For example, the switch 650 of the balloon latch 642 may include transistors 613 and 614. The first terminals of the transistors 613 and 614 are coupled together and may be further connected to a power voltage (e.g., VDDR). The second terminals of the transistors 613 and 614 are coupled together and may be further connected to a first terminal of the transistor 611. A second terminal of the transistor 611 may be connected to a first terminal of the transistor 612 and a second terminal of the transistor 612 may be connected to the first terminals of the transistors 615 and 616 of the switch 652. The first terminals of the transistors 615 and 616 are coupled together. The second terminals of the transistors 615 and 616 are coupled together and may be further connected to another voltage source (e.g., VSS). The second terminal of the transistor 611 and the first terminal of the transistor 612 are also connected to node H. The gate electrodes of the transistors 611 and 612 may be coupled together and further connected to node G. In one or more embodiments, the transistors 615 and 616 may receive the control signals B2 and B1 at their respective gate electrodes and therefore may be controlled by the control signals B2 and B1. The transistors 613 and 614 may receive the control signals B2N and BIN at their respective gate electrodes and therefore may be controlled by the control signals B2N (complement of B2) and BIN (complement of B1). In FIG. 4, the transistors 613, 614, and 611 may be P-type MOSFETs and the transistors 612, 615, and 616 may be N-type MOSFETs.

In FIG. 4, the output inverter 662 includes transistors 664 and 666. A first terminal of the transistor 664 may be connected to a power voltage (e.g., VDD) and a second terminal of the transistor 664 may be connected to a first terminal of the transistor 666. The second terminal of the transistor 664 and the first terminal of the transistor 666 are also connected to the output Q. A second terminal of the transistor 666 may be connected to another power voltage (e.g., VSS). The gate electrodes of the transistors 664 and 666 may be connected to node J. In FIG. 4, the transistor 664 may be a P-type MOSFET and the transistor 666 may be an N-type MOSFET.

For example, in order to save leakage power loss from a balloon latch, in the balloon latch circuit 108 of FIG. 1, the power is cut off from the balloon latch 108 during the normal operation (or active mode) by the switches 320, 322, 324, and 326. For example, during normal operation (or active mode), the balloon latch 108 may be turned off by cutting the path from always-ON supply of the balloon latch 108 to VSS (e.g., "0 V" or "ground" voltage) based on the sequencing of the control signals B1 and B2. For example, because, the back to back inverters 316 and 318 receive power (e.g., VDDR) via switches 320 (e.g., 650: 613, 614) and 324 (e.g. 658), respectively, during normal operation (or active mode), by turning off the switches 320 (e.g., 650: 613, 614) and 324 (e.g. 658) that are controlled by the control signals BIN (complement of B1) and B2N (complement of B2), the balloon latch 108 may be turned off and the leakage power loss from the balloon latch 108 may be reduced or minimized. However, as shown in FIG. 2, just before the sleep mode (as indicated by VDD being zero when the first latch 104 and the second latch 106 is powered down), in order to retain (e.g., save) the state of the second latch 106, the balloon latch 108 may remain turned on. In one or more embodiments, the balloon latch 108 always remains turned on or turns on before retention flip flop 100 goes into the sleep mode, in order to save the current state of the second latch 106 (e.g., input voltage of the second latch 106 or voltage at node 130). In the retention flip flop 100 of FIG. 1, a common path 120 is used for both save and restore operations and this common path 120 is controlled by the control signal B2 as the switch 328 connecting the balloon latch 108 with the second latch 106 is controlled by the control signal B2 and its complement B2N. In this case with B1 and B2 control signals with modified sequences, the state of B1 determines whether to perform a save operation or to perform a restore operation as the switches 324 and 326 are controlled by the control signal B1 and its complement BIN. For example, when B1=logic 0, save operation is performed and when B1=logic 1, the restore operation is performed. Further, the second latch 106 of FIG. 1 is controlled by the control signals B1 as well as B2.

Also, for multi-bit implementation, the pull-up/down control (320, 322, 324, and 326) of the balloon latch 108 may be shared for better layout area saving.

Figure 5:
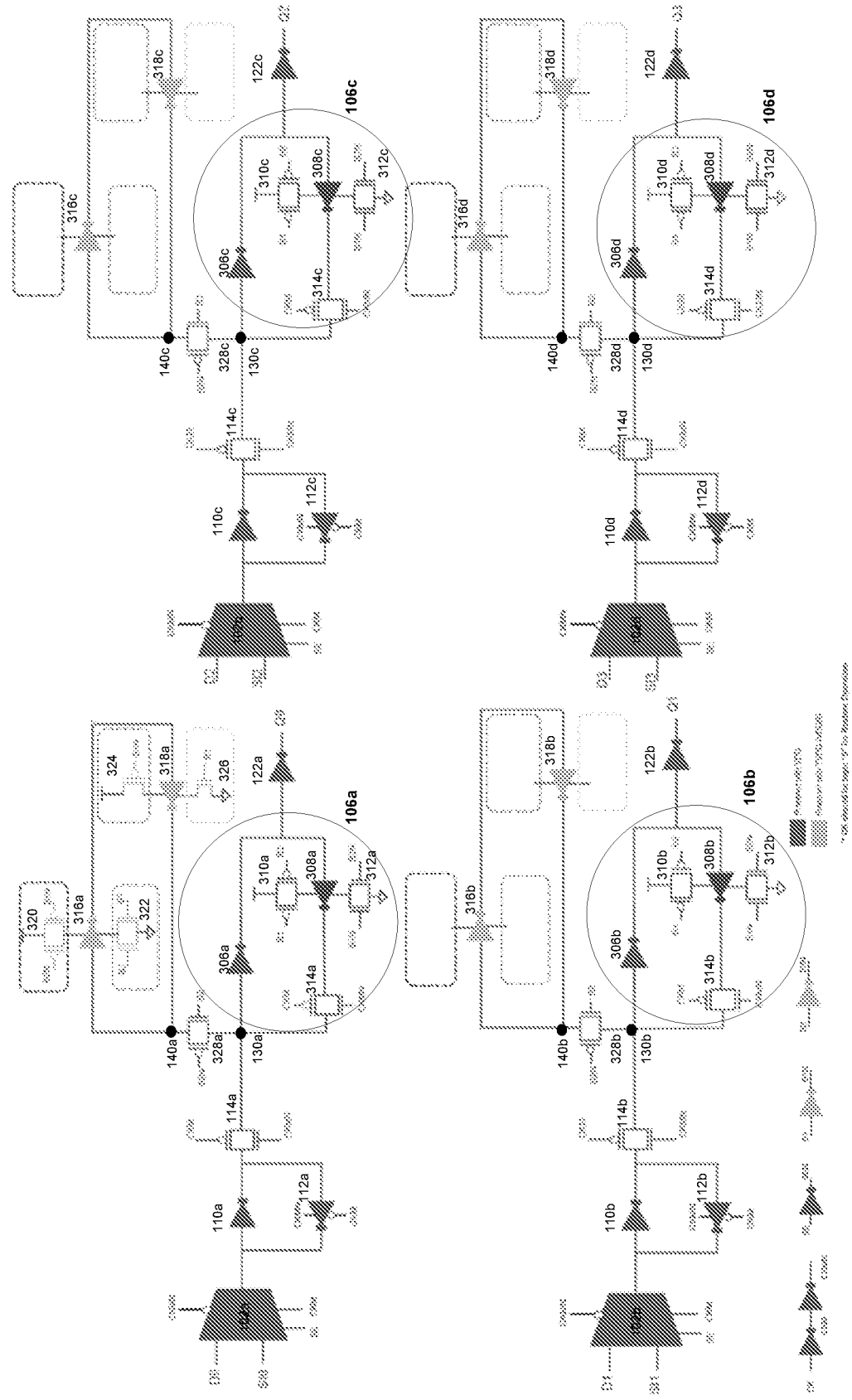
FIG. 5 illustrates a 2-pin, multi bit implementation of the retention flip flop circuit of FIG. 1, according to one or more embodiments.

FIG. 5 illustrates a 2-pin, multi bit implementation of the retention flip flop circuit of FIG. 1. For example, as shown in FIG. 5, to generate each output bit, Q0, Q1, Q2, and Q3, the retention flip flop circuit 100 may be used with different inputs to the multiplexer 102. For example, for output Q0, the inputs to the multiplexer 102a are D0 and SI0. For output Q1, the inputs to the multiplexer 102b are D1 and SI1. For output Q2, the inputs to the multiplexer 102c are D2 and SI2. For output Q3, the inputs to the multiplexer 102d are D3 and SI3. However, the pull-up/down control (e.g., switches 320, 322, 324, and 326) of the balloon latch may be shared between the retention flip flop circuits 100 for each output bit for better area saving. For example, in one or more embodiments, the node 140a, 140b, 140c, and 140d of the retention flip-flop circuits to generate output bits Q0, Q1, Q2, and Q3, may not be coupled together. In this case, the state of the second latch 106a, 106b, 106c, and 106d of the retention flip-flop circuits corresponding to the output bits Q0, Q1, Q2, and Q3, may be saved and restored simultaneously, since the control is same across all the retention flip flops. Each output bit has its corresponding balloon latch to store the state of its respective secondary latch (e.g., the second latch 106a, 106b, 106c, and 106d).

In FIG. 5, the inverters 110a, 110b, 110c, and 110d may be the same as the inverter 110 of FIG. 1, the inverters 112a, 112b, 112c, and 112d may be the same as the inverter 112 of FIG. 1, the switches 114a, 114b, 114c, and 114d may be the same as the switch 114 of FIG. 1, the inverters 306a, 306b, 306c, and 306d may be the same as the inverter 306 of FIG. 1, the inverters 308a, 308b, 308c, and 308d may be the same as the inverter 308 of FIG. 1, the switches 310a, 310b, 310c, and 310d may be the same as the switch 310 of FIG. 1, the switches 312a, 312b, 312c, and 312d may be the same as the switch 312 of FIG. 1, the switches 314a, 314b, 314c, and 314d may be the same as the switch 314 of FIG. 1, the switches 328a, 328b, 328c, and 328d may be the same as the switch 328 of FIG. 1, the inverters 316a, 316b, 316c, and 316d may be the same as the inverter 316 of FIG. 1, and the inverters 318a, 318b, 318c, and 318d may be the same as the inverter 318 of FIG. 1.

For example, the present retention flip flop 100 having the balloon latch 108 and the second latch 106 may have relatively 20% saving of VDDR leakage and 9% saving in total leakage (VDD+VDDR). Further, the present retention flip flop 100 having the balloon latch 108 and the second latch 106, due to added stacking of transistors, may have relatively 20% improvement in retention mode leakage.

Also, in the retention flip flop 100, operational modes leakage power saving may be relatively 10-15%.

For example, as shown in Table 1, in the retention flip flop circuit 100 of FIG. 1, in a first mode, 90% of the total duration of time in which the circuit is active, the circuit may be in the retention mode and 10% of total duration of time in which the circuit is active, the circuit may be in the normal mode. However, in a second mode, 90% of the total duration of time in which the circuit is active, the circuit may be in the normal mode and 10% of total duration of time in which the circuit is active, circuit may be in the retention mode. As shown in Table, 1, in the present 2-pin retention flip flop 100 of FIG. 1 according to one or more embodiment of the present disclosure, VDDR leakage and total leakage in normal mode is reduced compared to an other 2-pin retention flip flop.

TABLE 1

| CELL | 1$^{st}$ Mode (90% Normal + 10% Retention) | 2$^{nd}$ Mode (10% Normal + 90% Retention) | VDDR Leakage in Normal Mode | Total Leakage in Normal Mode |
| --- | --- | --- | --- | --- |
| BASE FF (V2) | 1 | 1 | — | 1 |
| Other 2-Pin RETFF | 1.58 | 6.92 | 1 | 1.52 |
| Present 2-Pin RETFF | 1.44 | 5.72 | 0.73 | 1.39 |

Moreover, the present 2-pin retention flip flop (RETFF) 100 as shown in FIG. 1 may have relatively better performance, due to the reduction of loading in the CLK2Q path (as shown in Table 2).

TABLE 2

| CELL | Ave Td (Ratio) | Worst Td (Ratio) |
| --- | --- | --- |
| BASE FF (V2) | 1 | 1 |
| Other 2-Pin RETFF | 1.03 | 1.03 |
| Present 2-Pin RETFF | 1.02 | 1.02 |

Further, as shown in Table 3, by cutting the path from always-ON supply of the balloon latch 108 to VSS in the retention flip flop circuits 100 for each output bits (e.g., as shown in FIG. 5), there may be relatively 45% saving in VDDR leakage. Also, there may be relatively 13% saving in total leakage (VDD+VDDR). The multi bit implementation of the present retention flip flop, as shows in FIG. 5 reduces layout area by relatively 8-9%.

TABLE 3

| CELL | 1$^{st}$ Mode (90% Normal + 10% Retention) | 2$^{nd}$ Mode (10% Normal + 90% Retention) | VDDR Leakage in Normal Mode | Total Leakage in Normal Mode |
| --- | --- | --- | --- | --- |
| BASE 4-bit FF (V2) | 1 | 1 | — | 1 |
| Other 4-bit 2-Pin RETFF | 1.63 | 6.31 | 1 | 1.58 |
| Present 4-bit 2-Pin RETFF | 1.43 | 5.77 | 0.55 | 1.38 |

For example, in the 4-bit implementation of the 2-pin retention flip flop of FIG. 5, by sharing the pull-up/down control (320, 322, 324, and 326) of the balloon latch 108 between the retention flip flop circuits 100 for each output bit, there may be relatively 8% saving in layout area. Also, in the 8-bit implementation of the 2-pin retention flip flop, by sharing the pull-up/down control (320, 322, 324, and 326) of the balloon latch 108 between the retention flip flop circuits 100 for each output bit, there may be relatively 12% saving in area. This is shown in the below tables (e.g., Table 4 to Table 5).

TABLE 4

| 4-bit AREA Comparison | Ratio |
| --- | --- |
| BASE 4-bit FF (V2) | 1 |
| Other 4-bit 2-Pin RETFF | 1.47 |
| Present 4-bit 2-Pin RETFF | 1.35 |

TABLE 5

| 8-bit AREA Comparison | Ratio |
| --- | --- |
| BASE 8-bit FF (V2) | 1 |
| Other 8-bit 2-Pin RETFF | 1.47 |
| Present 8-bit 2-Pin RETFF | 1.29 |

What is claimed is:

1. A circuit comprising:
a first latch;
a second latch coupled to the first latch at an output terminal of the first latch; and
a third latch coupled to the second latch at an input terminal of the second latch, wherein the third latch comprises:
a first inverter and a second inverter, the first inverter being coupled between the input terminal of the second latch and an input terminal of the second inverter and the second inverter being coupled between an output terminal of the first inverter and an input terminal of the first inverter;
a first switch connecting the first inverter to a first voltage source;
a second switch connecting the first inverter to ground voltage;
a third switch connecting the second inverter to the first voltage source;
a fourth switch connecting the second inverter to the ground voltage; and
a fifth switch connecting the input terminal of the second latch and the input terminal of the first inverter.

2. The circuit of claim 1, wherein:
the first switch comprises a first transistor and a second transistor;
the first inverter comprises a third transistor and a fourth transistor;
the second switch comprises a fifth transistor and a sixth transistor;
the third switch comprises a seventh transistor;
the second inverter comprises an eighth transistor and a ninth transistor;
the fourth switch comprises a tenth transistor;
the fifth switch comprises an eleventh transistor and a twelfth transistor;
first terminals of the first transistor and the second transistor are coupled to the first voltage source and second terminals of the first and second transistors are coupled to a first terminal of the third transistor;
a second terminal of the third transistor is coupled to a first terminal of the fourth transistor;
a second terminal of the fourth transistor is coupled to first terminals of the fifth and sixth transistors;
a first terminal of the seventh transistor is coupled to the first voltage source and a second terminal of the seventh transistor is coupled to a first terminal of the eighth transistor;
a second terminal of the eighth transistor is coupled to a first terminal of the ninth transistor and a second terminal of the ninth transistor is coupled to a first terminal of the tenth transistor;
a second terminal of the tenth transistor is connected to the ground voltage;
first terminals of the eleventh and twelfth transistors are coupled to gate electrodes of the third and fourth transistors, the second terminal of the eighth transistor, and the first terminal of the ninth transistor; and
second terminals of the eleventh and twelfth transistors are coupled to the output terminal of the first inverter.

3. The circuit of claim 2, wherein the first switch, the second switch, the third switch, and the fourth switch are shared between a plurality of retention flip flop circuits of a multi-bit retention flip flop circuit to generate a corresponding output bit from among a plurality of output bits of the multi-bit retention flip flop circuit, each of the plurality of retention flip flop circuits comprises the circuit.

4. The circuit of claim 1, wherein the second latch comprises:
a third inverter and a fourth inverter, the third inverter having an input terminal coupled to the output terminal of the first latch and an output terminal coupled to an input terminal of the fourth inverter, the fourth inverter being coupled between the input terminal and the output terminal of the third inverter;
a sixth switch connecting the fourth inverter to a second voltage source;
a seventh switch connecting the fourth inverter to the ground voltage; and
an eighth switch connecting an output terminal of the fourth inverter to the input terminal of the third inverter.

5. The circuit of claim 4, wherein the input terminal of the third inverter is coupled to the output terminal of the first latch via a ninth switch, and
wherein the fifth switch is coupled to the output terminal of the first latch via the ninth switch.

6. The circuit of claim 4, wherein the output terminal of the third inverter is coupled to an input terminal of a fifth inverter and an output terminal of the fifth inverter is coupled to an output of the circuit.

7. The circuit of claim 4, wherein:
the third inverter comprises a first transistor and a second transistor, wherein a first terminal of the first transistor is connected to the second voltage source, a second terminal of the first transistor is coupled to a first terminal of the second transistor, a second terminal of the second transistor is connected to the ground voltage, and gate electrodes of the first and second transistors are coupled to the output terminal of the first inverter;
the sixth switch comprises a third transistor and a fourth transistor;
the fourth inverter comprises a fifth transistor and a sixth transistor;
the eighth switch comprises a seventh transistor and an eighth transistor;
the seventh switch comprises a ninth transistor and a tenth transistor;

first terminals of the first and second transistors are connected to the second voltage source and second terminals of the first and second transistors are coupled to a first terminal of the fifth transistor;

a second terminal of the fifth transistor is coupled to a first terminal of the seventh transistor and a second terminal of the seventh transistor is coupled to a first terminal of the eighth transistor, the second terminal of the seventh transistor and the first terminal of the eighth transistor being coupled to the output terminal of the first latch and gate electrodes of the first and second transistors;

a second terminal of the eighth transistor is coupled to a first terminal of the sixth transistor, a second terminal of the sixth transistor is coupled to first terminals of the ninth and tenth transistors, and second terminals of the ninth and tenth transistors are coupled to the ground voltage; and the second terminal of the first transistor and the first terminal of the second transistor are coupled to gate electrodes of the fifth and sixth transistors.

8. The circuit of claim 1, wherein the first switch and the second switch are configured to be turned on or turned off based on a first control signal and a second control signal;

wherein the third switch and the fourth switch are configured to be turned on or turned off based on the first control signal, and the fifth switch is configured to be turned on or turned off based on the second control signal;

wherein the circuit is configured to operate in a sleep mode or an active mode;

wherein in the active mode, the first latch and the second latch are turned on, and in the sleep mode, the first latch and the second latch are turned off and the third latch is turned on;

wherein when the circuit transitions from the active mode to the sleep mode, the third latch is configured to perform a save operation by saving a state of the second latch before the sleep mode, and when the circuit transitions from the sleep mode to the active mode, the third latch is configured to perform a restore operation by restoring the state of the second latch before the save mode from the third latch to the second latch; and wherein the circuit is configured to perform the save operation or the restore operation based on the first control signal.

9. The circuit of claim 1, wherein the first latch and the second latch are configured to receive a second voltage from a second voltage source different from the first voltage source, wherein the first voltage source is an always-on (AON) power supply and the second voltage source is a switchable power supply or a power-gated supply.

10. A method of controlling a circuit, the method comprising:

receiving a first value of a first control signal at the circuit;

based on receiving the first value of the first control signal, saving a state of a first latch to a second latch via a datapath of the circuit, wherein the second latch is connected to an input terminal of the first latch;

receiving a second value of the first control signal;

turning off the first latch for a first time period based on determining that the state of the first latch is saved to the second latch, the determining being based on the receiving the second value of the first control signal;

turning on the first latch based on determining that the first time period is completed;

receiving the first value of the first control signal; and based on receiving the first value of the first control signal, restoring the state of the first latch from the second latch to the first latch via the datapath of the circuit.

11. The method of claim 10, wherein the state of the first latch comprises a voltage at the input terminal of the first latch.

12. The method of claim 10, further comprising:

receiving, a first value of a second control signal, wherein the state of the first latch is saved to the second latch based on receiving the first value of the second control signal; and receiving, a second value of the second control signal, wherein the state of the first latch is restored from the second latch to the first latch based on receiving the second value of the second control signal.

13. The method of claim 12, further comprises:

based on receiving the first value of the first control signal, turning on a first switch of the second latch to connect the input terminal of the first latch to a first node to save the state of the first latch, the first node being coupled to an output terminal of the first switch, an input terminal of a first inverter of the second latch, and an output terminal of a second inverter of the second latch;

based on receiving the second value of the first control signal, turning off the first switch to disconnect the input terminal of the first latch from the first node;

based on receiving the first value of the second control signal, maintaining a voltage at the first node that represents the state of the first latch by enabling the first inverter and the second inverter;

based on receiving the second value of the second control signal, restoring the state of the first latch from the second latch to the first latch by turning on the first switch to connect the input terminal of the first latch to the first node, wherein the datapath comprises the input terminal of the first latch, the first switch, and the first node.

14. The method of claim 10, further comprising:

receiving, at the first latch, a first supply voltage from a first voltage source; and receiving, at the second latch, a second supply voltage, different from the first supply voltage, from a second voltage source, wherein the first voltage source is a switchable power supply or a power-gated supply and the second voltage source is an always-on (AON) power supply.

15. A non-transitory computer readable medium comprising stored instructions, which when executed by a processor, cause the processor to generate a digital representation of a circuit comprising:

a first latch;

a second latch coupled to the first latch at an output terminal of the first latch; and a third latch coupled to the second latch at an input terminal of the second latch, wherein the third latch is configured to:

receive a first value of a first control signal;

based on receiving the first value of the first control signal, save a state of the second latch to the third latch via a datapath of the circuit;

receive a second value of the first control signal; and based on receiving the second value of the first control signal, restore the state of the second latch from the third latch to the second latch via the datapath of the circuit.

16. The non-transitory computer readable medium of claim 15, wherein the third latch is further configured to:
receive a first value of a second control signal;
based on receiving the first value of the second control signal, turn on a first switch of the third latch to connect the input terminal of the second latch to a first node to save the state of the second latch, the first node being coupled to an output terminal of the first switch, an input terminal of a first inverter of the third latch, and an output terminal of a second inverter of the third latch;
receive a second value of the second control signal;
turn off the first switch to disconnect the input terminal of the second latch from the first node;
maintain a voltage at the first node that represents the state of the second latch;
receiving the first value of the second control signal;
based on receiving the second value of the first control signal and the first value of the second control signal, restoring the state of the second latch from the third latch to the second latch by turning on the first switch to connect the input terminal of the second latch to the first node,
wherein the datapath comprises the input terminal of the second latch, the first switch, and the first node.

17. The non-transitory computer readable medium of claim 16, wherein the third latch is further configured to:
maintain the voltage at the first node by enabling the first inverter and the second inverter by connecting the first inverter to an always-on (AON) power supply via a second switch and by connecting the second inverter to the AON power supply via a third switch.

18. The non-transitory computer readable medium of claim 15, wherein:

the circuit is configured to operate in a sleep mode or an active mode;
in the active mode, the first latch and the second latch are turned on, and in the sleep mode, the first latch and the second latch are turned off and the third latch is turned on;
when the circuit transitions from the active mode to the sleep mode, the third latch is configured to perform a save operation by saving the state of the second latch, and when the circuit transitions from the sleep mode to the active mode, the third latch is configured to perform a restore operation by restoring the state of the second latch from the third latch to the second latch; and
the circuit is configured to perform the save operation or the restore operation based on the first control signal.

19. The non-transitory computer readable medium of claim 15, wherein during the saving of the state of the second latch to the third latch and during the restoring the state of the second latch from the third latch to the second latch, the third latch is configured to receive a first value of a second control signal.

20. The non-transitory computer readable medium of claim 15, wherein the circuit is configured to:
receive, at the first latch and at the second latch, a first supply voltage from a first voltage source; and
receive, at the third latch, a second supply voltage, different from the first supply voltage, from a second voltage source,
wherein the first voltage source is a switchable power supply or a power-gated supply and the second voltage source is an always-on (AON) power supply.

* * * * *